United States Patent [19]
Schlosser

[11] 3,806,825
[45] Apr. 23, 1974

[54] DIGITAL CIRCUIT FOR ADJUSTING THE FREQUENCY OF A VARIABLE FREQUENCY OSCILLATOR

[75] Inventor: Karl Schlosser, Planegg, Germany

[73] Assignee: Siemens Aktiengesellschaft, Berlin and Munich, Germany

[22] Filed: Dec. 15, 1972

[21] Appl. No.: 315,504

[30] Foreign Application Priority Data

Dec. 22, 1971 Germany .......................... 2163971

[52] U.S. Cl. .................................. 331/1 A, 331/16
[51] Int. Cl. .......................................... H03b 3/04
[58] Field of Search .............................. 331/1 A, 16

[56] References Cited

UNITED STATES PATENTS 3,185,938 5/1965 Pelosi .................................. 331/11

*Primary Examiner*—John Kominski
*Attorney, Agent, or Firm*—Hill, Sherman, Meroni, Gross & Simpson

[57] ABSTRACT

In a circuit for adjusting the frequency of a variable frequency oscillator, a counter is provided for counting the cycles of said oscillator during a predetermined time period, and for adjusting the frequency of the variable frequency oscillator in accordance with the pulses counted during said period. When the cycles produced by an oscillator during the predetermined period are less than a desired quantity, a second counter is incremented by the oscillator. The content of the second counter is converted into a d.c. voltage for controlling the frequency of the oscillator.

12 Claims, 4 Drawing Figures

DIGITAL CIRCUIT FOR ADJUSTING THE FREQUENCY OF A VARIABLE FREQUENCY OSCILLATOR

BACKGROUND OF THE INVENTION

1. Field of the Invention

The present invention relates to a digital circuit for controlling the frequency of a variable frequency oscillator, and more particularly to such a circuit which employs means for comparing the time required for the oscillator to produce a predetermined number of cycles with a desired time interval therefore.

2. The Prior Art

In the prior art it has been customary to measure the time required for a variable frequency oscillator to produce a predetermined number of cycles of oscillation, and to produce a train of pulses which is integrated in order to produce a control voltage for controlling the frequency of the oscillator. Such circuits have the disadvantage of being relatively slow in the rate at which the frequency of the oscillator can be made to conform to the desired frequency, particularly when a relatively long integration time constant is employed. The speed of response of the oscillator is also slower than desired, when a change is made in the desired frequency. Moreover an additional disadvantage results from the fact that the control output of the integrator is lost in the operation of the oscillator is discontinued, and the desired oscillator frequency is therefore not available when oscillator operation is resumed.

Accordingly, it is desirable to overcome these disadvantages and to produce a circuit for controlling the frequency of a variable frequency oscillator which responds rapidly to a change in the desired frequency and which stores the necessary control values to enable the oscillator to resume operation at the correct frequency.

SUMMARY OF THE INVENTION

A principal object of the present invention is, therefore, to provide apparatus for controlling the frequency of a variable frequency oscillator in which an analog integrator is not required.

Another object of the present invention is to provide a system which is adapted to respond quickly to deviations in the frequency of the oscillator from a desired frequency, and to reproduce a desired frequency when operation of the oscillator is resumed.

These and other objects and advantages of the present invention will become manifest upon an examination of the following description and the accompanying drawings.

In one embodiment of the present invention there is provided apparatus for controlling the frequency of a variable frequency oscillator including a first connected to the oscillator and adapted to produce an output pulse after a predetermined number of cycles of said oscillator have been counted, means for producing a pulse of predetermined length corresponding to the duration required by said predetermined number of pulses when the oscillator is operating at the desired frequency, and a second counter connected to the oscillator for counting cycles of said oscillator in a forward or reverse direction in response to the difference between the frequency of the oscillator and the desired frequency, and a digital to analog converter connected to the second counter for producing a d.c. voltage to control the frequency of the variable frequency oscillator.

BRIEF DESCRIPTION OF THE DRAWINGS

Reference will now be made to the accompanying drawings in which:

Referring now to FIG. 1, an oscillator 1 is controllable in its frequency in accordance with the voltage presented to a terminal 8. The output of the oscillator is available in an output 2 and another output A1, which serve to connect the output of the oscillator to two separate locations. Alternatively, both terminals 2 and A′ may be connected together to the output of the oscillator. The terminal A′ is connected to an input terminal A of a gate 3. The gate 3 has another input terminal B connected to the output of a pulse generator 30 which periodically produces a pulse P, having a duration $T_o$. During the pulse P, the gate 3 is adapted to convey the output of the oscillator 1 to an output Z′, connected to an input terminal Z of a counter 4. The counter 4 is adapted to count the pulses of the oscillator 1 and if it reaches its capacity before the gate 3 is closed at the end of the pulse P, a signal is produced on an overflow output 5 of the counter 4. The output 5 is connected to a third input C of the gate 3 and functions under certain conditions, to disable the output Z′ of the gate 3 and to enable one of two additional outputs of the gate 3 V′ or R′. The output V′ is connected to an input V of a second counter 6, for counting the counter 6 in a forward direction, while the output R′ is connected to an input terminal R of the counter 6, for counting the counter 6 in a reverse direction. The terminal R′ is adapted to receive the output of the gate 3 when the output pulse on the terminal 5 of the counter 4 is produced prior to the end of the pulse P. Thereafter, for the remainder of the duration of the pulse P, pulses from the oscillator 1 are conveyed to the input R of the counter 6 to count the counter 6 in a reverse direction, decrementing the counter 6 with each pulse. The content of the counter 6 is thus reduced to a lower value. A plurality of output lines 6*a* are connected to inputs of a digital to analog converter 7, which produces an output voltage $U_r$ which is connected to the input 8 of the oscillator 1. A reduction in the content of the counter 6 decreases the lever of the voltage $U_r$, with a result that the frequency of the oscillator 1 is reduced.

Figure 1:
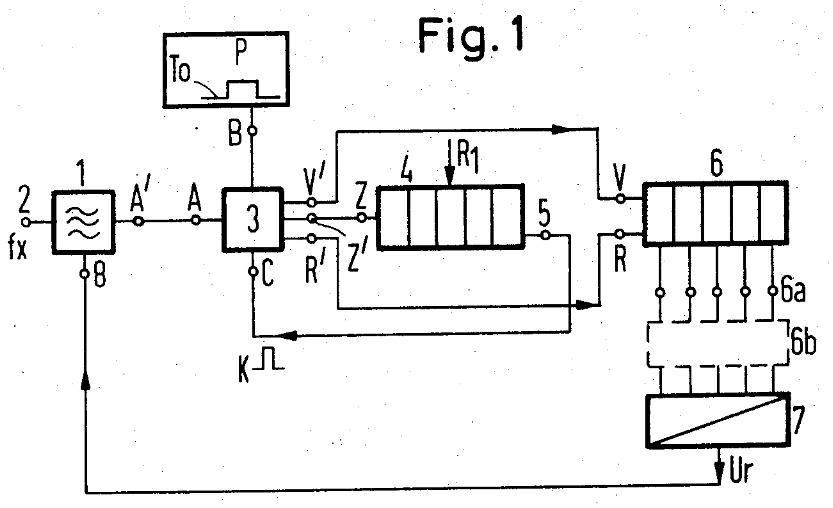
FIG. 1 is a functional block diagram of an illustrative embodiment of the present invention.

If the frequency of the oscillator 1 is too low, the end of the pulse P is reached before the overflow pulse is produced by the counter 4 at the output 5. The output of the gate 3 is then delivered to the terminal V′, as well as continuing on the output Z′, until the overflow pulse is produced. This serves to increase the content of the counter 6. An increase in the content of the counter 6 results in an increase in the level of the voltage $U_r$, and brings about a corresponding increase in the frequency of the oscillator 1, so as to bring into conformity with the desired frequency.

An input $R_1$ to the counter 4 resets the counter 4 prior to each pulse P, so the counter 4 is counted to its full capacity before each overflow pulse 5 is produced. Of course, it is necessary to employ a counter 4 having a radix equal to the number of pulses which are desired to be produced by the oscillator 1 during the period of the pulse P produced by the pulse generator 30. Alternatively, a counter 4 of larger radix than necessary may be employed, in which case an initial input indicated by the arrow $R_1$ is preset into the counter 4 prior to each pulse P, to permit the overflow pulse to be produced at the output terminal 5 when the appropriate number of pulses have been counted by the counter 4.

The pulse generator 30 produced the pulses P periodically, so that each time a new pulse P is produced a new comparison and a new correction, if necessary, is made in the frequency of the oscillator 1. The control voltage $U_r$ is produced continuously, according to the value stored in the counter 6, which is the digital equivalent of the control voltage $U_r$. The content of the counter 6 is maintained in storage indefinitely. Therefore if the oscillator 1 is disabled for a period, when its operation is restored, the counter 6 maintains the correct digital content corresponding to the necessary control voltage for operation of the oscillator 1 at the appropriate frequency.

When the counter 4 is a counter of adjustable radix, the quantity which is preset each cycle into the counter is the complement of the desired radix, corresponding to the desired number of pulses to be counted by the counter 4 before the overflow pulse is produced. When the counter 4 is a decade counter, the lowest order is preset to the tens complement of the lowest order of the desired radix, and higher order stages are each set to the nines complement of the corresponding order of the desired radix.

An intermediate memory *6b* interposed between the second counter 6 and the digital to analog converter 7 may optionally be employed, to prevent the changing state of the counter 6 from effecting the operation of the digital to analog converter 7. A plurality of gates, one for each stage of the memory *6b* are included therein and operated by a control pulse which occurs at an appropriate time in each cycle to cause the content of the counter 6 to be set into the memory *6b* for storage. The control pulse occurs after the counter 6 has ceased counting during each cycle.

Figure 2:
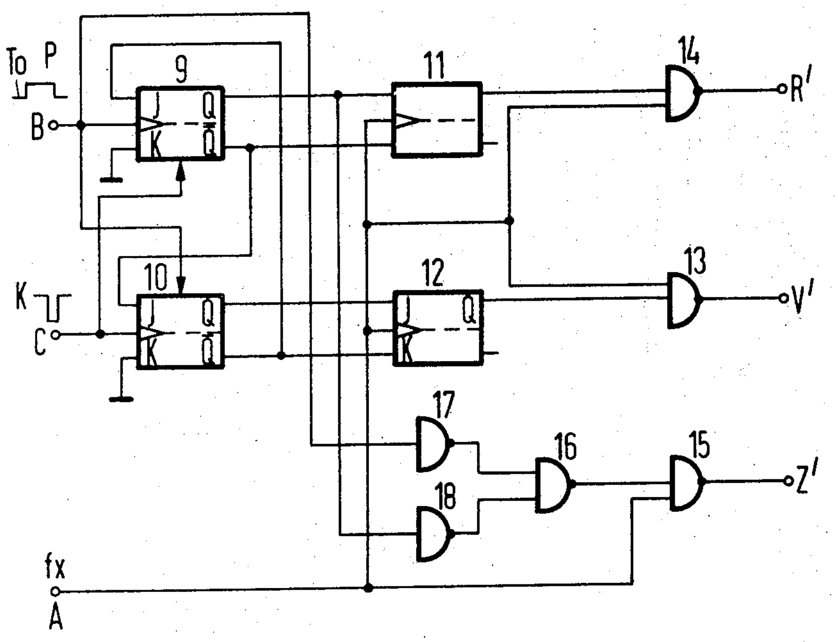
FIG. 2 is a functional block diagram of a gate employed in the apparatus of FIG. 1.

Referring now to FIG. 2 a preferred embodiment of the gate circuit 3 is illustrated. A pair of J–K flip-flops 9 and 10 are employed, with the B and C inputs of the gate 3 being connected to the counting inputs of the two flip-flops, respectively. Initially both flip-flops are reset to their K states so that their outputs $\bar{Q}$ are high. The J input of each of the flip-flops 9 and 10 is connected to the $\bar{Q}$ output of the opposite flip-flop.

The Q and $\bar{Q}$ outputs of the flip-flop 9 are connected, respectively, to the J and K inputs of another flip-flop 11, and the Q and $\bar{Q}$ outputs of the flip-flop 10 are connected respectively, to the J and K inputs of a flip-flop 12. The Q output of the flip-flop 11 is connected to one input of a NAND gate 14, which has its second input connected to the terminal A, and its output connected to the terminal R'.

The Q output of the flip-flop 12 is connected to one input of a NAND gate 13, which has its other input connected to the terminal A and its output connected to the terminal V'.

An inverter 17 has an input connected to the input terminal B, and its output connected to an input of a NAND gate 16. Another inverter 18 connects the Q output of the flip-flop 9 to the other input of the NAND gate 16, and the output of the NAND gate 16 is connected to one input of a NAND gate 15. The other input of the NAND gate 15 is connected to the terminal A and the output of the NAND gate 15 is connected to the output terminal Z'.

When the oscillator 1 is producing a frequency which is higher than the desired frequency, the output pulse K is produced from the output terminal 5 of the counter 4 before the end of the pulse P, and appears at the counting input of the flip-flop 10, via the terminal C. The negative going K pulse changes the state of the flip-flop 10, and causes the Q output of the flip-flop 10 to go high, which sets the flip-flop 12 to its J state. The flip-flop 12 produces a high output at its Q output, which enables the NAND gate 13 to pass pulses from the terminal A to the output terminal V'. When the negative going trailing edge of the pulse P occurs at the input B, the flip-flop 10 is reset. The $\bar{Q}$ output of the flip-flop 10 goes high, resetting the flip-flop 12 and dissabling the gate 13. The flip-flop 9 is not set by the pulse on the input B, because the $\bar{Q}$ output from the flip-flop 10 is low at this time.

When the pulse P terminates prior to the occurrence of the K pulse, the flip-flop 9 is set, bringing about a setting of the flip-flop 11 which is connected thereto, and enabling the NAND gate 14 to pass pulses from the terminal A to the terminal R'. When the negative K pulse arrives, the flip-flop 9 is reset which operates to reset the flip-flop 11 and inhibit the gate 14.

The output Z' of the gate circuit is controlled by the NAND gate 15 which is opened by the pulse P when it is applied to the terminal B. The gate 15 is maintained open by the Q output of the flip-flop 9, which goes high when the pulse P terminates before the overflow pulse is produced on the output 5, to ensure that counting continues until the overflow pulse K is produced.

Figure 3:
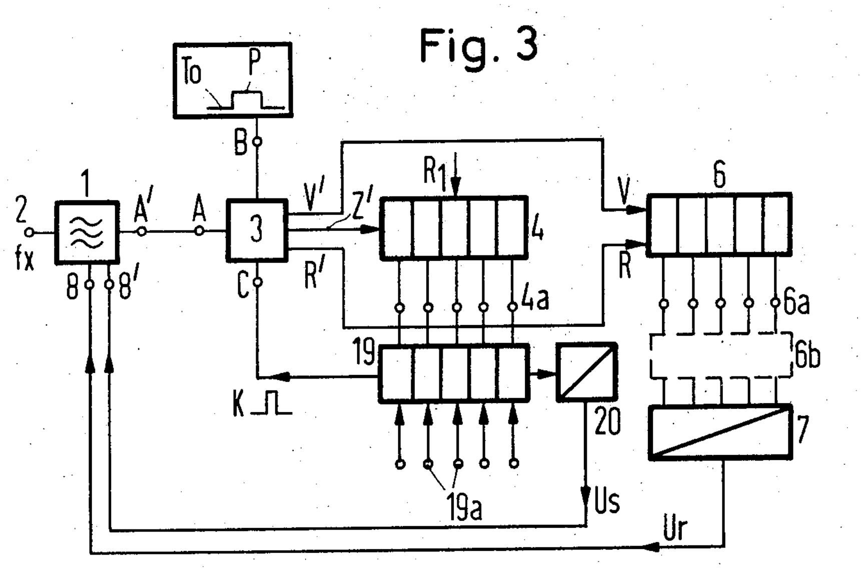
FIG. 3 is a functional block diagram of an alternative embodiment of the present invention.

Referring now to FIG. 3, an alternative embodiment of the present invention is illustrated. Corresponding parts which have already been described with reference to FIG. 1 are indicated by identical reference numerals.

The apparatus of FIG. 3 differs from that of FIG. 1 by the provision of a comparator 19 which is adapted to compare the instantaneous value manifested by the counter 4 with the voltage levels on a plurality of input terminals *19a*. The terminals *19a*, are provided with voltage levels in accordance with the desired frequency of the oscillator 1, and the comparator 19 is adapted to produce an output signal K when the counter 4 has reached the valve corresponding to the condition of the terminals *19a*. This avoids the need for using a counter 4 of a predetermined radix, or for presetting the counter 4 with the complement of the number of pulses desired to be counted. The operation of the gate 3 with its three outputs connected to the counter 4 and to the two inputs of the counter 6 is the same as illustrated and described with reference to FIG. 1.

A second digital to analog convertor 20 is provided in association with the comparator 19 in order to produce an output voltage $U_s$ applied to a terminal 8' of the oscillator 1. A voltage level applied to the terminal 8', has the same effect as one connected to the terminal 8. The two terminals 8 and 8' may be connected together by a resistor summing network or the like so that the oscillator 8 is controlled by a combination of the two voltage levels $U_s$ and $U_r$. The digital to analog converter 20 is responsive directly to the condition of the terminals 19a so that it is adapted to make an immediate adjustment in the frequency of the oscillator 1 even before the next pulse is produced by the pulse generator 20. It thus achieves a much faster control of the frequency of the oscillator 1, and reduces the required capacitor for the counter 6.

In an additional modification of the apparatus of FIGS. 1 and 3, a counter or the like may be connected in series with the line connected to the input terminal C of the gate 3 to suppress a number of K pulses and to pass the K pulse after the occurrence of a certain number of suppressed pulses. In this way, a smaller capacity of counters 4 and 6 is sufficient.

Figure 4:
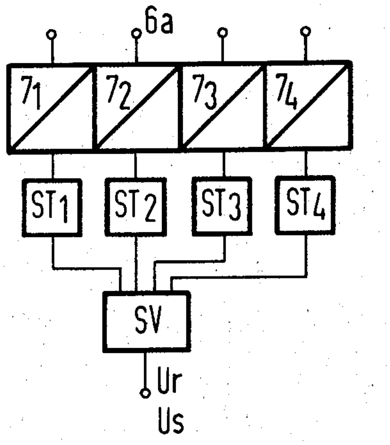
FIG. 4 is a functional block diagram of a digital to analog converter which may be employed with the present invention.

A preferred embodiment of the digital to analog convertors 7 and 20 is illustrated in FIG. 4. The convertor comprises a number of storage units 71–74 of which are connected to a corresponding stage of the counter 6, and which are adapted to store the content thereof. Each storage unit 71–74 is connected individually to a voltage divider ST1–ST4. The voltage dividers ST1–ST4 produce voltage values at the output thereof in binary coded fashion with the voltage level produced by the divider ST2 equal to twice the level to that produced by ST1, the level produced by ST3 equal to twice the level produced by ST2 and so on. The voltages produced by all the units ST1–ST4 are summed in the unit SV in order to produce the output voltage $U_r$ and $U_s$.

What is claimed is:

1. In apparatus for controlling the frequency of a variable frequency oscillator the combination comprising: a first counter connected to the output of said oscillator and operative to count the cycles produced by said oscillator and to produce a control pulse when a predetermined number of cycles have been counted, a second counter, control means connected to receive said control pulse for causing said second counter to be counted forwardly or backwardly in response to the difference between the period required by said first counter to count said predetermined number of cycles and a predetermined intervals, means for producing a control voltage in accordance with the content of said second counter, and means connecting said control voltage with said oscillator for controlling the frequency thereof.

2. Apparatus according to claim 1 including gate means responsive to said control means for connecting the output of said oscillator with the input of said first counter.

3. Apparatus according to claim 2, including means for generating a gate pulse having a length equal to said predetermined interval, and means connecting said pulse generator with said gate.

4. Apparatus according to claim 3, wherein said control means comprises first bistable means connected to said pulse generator for producing an output when the end of said gate pulse preceeds said control pulse, and second bistable means connected to said first counter for producing an output when said control pulse preceeds the end of said gate pulse.

5. Apparatus according to claim 4, including gate means interconnected with said first bistable means and with said oscillator for incrementing said first and second counters for each cycle of said oscillator until said control pulse is produced, and gate means connected with said second bistable means and with said oscillator for decrementing said second counter for each cycle of said oscillator until the end of said gate pulse.

6. Apparatus according to claim 1, wherein said means for producing a control voltage comprises a digital to analog converter.

7. Apparatus according to claim 6, wherein said digital to analog converter comprises a series of voltage dividers, one for each stage of said second counter, said voltage dividers each producing individual output voltages in response to its associated counter stage being in a particular condition, and means for summing the voltages produced by said voltage dividers.

8. Apparatus according to claim 1, including a comparator having a plurality of inputs connected to receive signals representative of a desired frequency for said oscillator, means connecting said comparator to said first counter for producing said control pulse when the content of said first counter compares with the signals supplied to said plurality of inputs.

9. Apparatus according to claim 8, including means for deriving a second control voltage directly from said signals supplied to said plurality of inputs, and means for connecting said second control voltage to said oscillator for controlling the frequency thereof.

10. Apparatus according to claim 9, wherein said means for deriving said second control voltage comprises a digital to analog converter.

11. Apparatus according to claim 1, wherein said control pulse is produced as the overflow pulse of said first counter.

12. Apparatus according to claim 11, including means for presetting said first counter to a predetermined state, whereby said overflow pulse is produced after a number of cycles of said oscillator which is less than the radix of said first counter.

* * * * *